United States Patent
Freer et al.

(10) Patent No.: US 7,862,662 B2
(45) Date of Patent: *Jan. 4, 2011

(54) METHOD AND MATERIAL FOR CLEANING A SUBSTRATE

(75) Inventors: Erik M. Freer, Campbell, CA (US); John M. de Larios, Palo Alto, CA (US); Katrina Mikhaylichenko, San Jose, CA (US); Michael Ravkin, Sunnyvale, CA (US); Mikhail Korolik, San Jose, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 908 days.

This patent is subject to a terminal disclaimer.

(21) Appl. No.: 11/532,491

(22) Filed: Sep. 15, 2006

(65) Prior Publication Data

US 2009/0308410 A1    Dec. 17, 2009

Related U.S. Application Data

(60) Provisional application No. 60/755,377, filed on Dec. 30, 2005.

(51) Int. Cl.
*B08B 3/00*    (2006.01)

(52) U.S. Cl. .............................. 134/34; 134/6

(58) Field of Classification Search ........................ None
See application file for complete search history.

(56) References Cited

U.S. PATENT DOCUMENTS

| | | | |
|---|---|---|---|
| 3,037,887 A | 6/1962 | Brenner et al. | 134/22 |
| 3,167,095 A | 1/1965 | Lissant | |
| 3,212,762 A | 10/1965 | Carroll et al. | 261/124 |
| 3,436,262 A | 4/1969 | Crowe et al. | 134/10 |
| 3,617,095 A | 11/1971 | Lissant | |
| 3,978,176 A | 8/1976 | Voegeli | 261/122 |
| 4,085,059 A | 4/1978 | Smith et al. | 252/118 |

(Continued)

FOREIGN PATENT DOCUMENTS

DE    40-38-587    6/1992

(Continued)

OTHER PUBLICATIONS

Aubert, JM et al.; "Aqueous foams"; Scientific America; 1986, 74-82, 254.

(Continued)

*Primary Examiner*—Michael Kornakov
*Assistant Examiner*—Eric Golightly
(74) *Attorney, Agent, or Firm*—Martine Penilla & Gencarella, LLP

(57) ABSTRACT

Methods for cleaning using a tri-state body are disclosed. A substrate having a particle deposited thereon is provided. A tri-state body that has a solid portion, liquid portion, and a gas portion is generated. A force is applied over the tri-state body to promulgate an interaction between the solid portion and the particle. The tri-state body is removed along with the particle from the surface of the substrate. The interaction between the solid portion and the particle causing the particle to be removed along with the tri-state body.

13 Claims, 5 Drawing Sheets

U.S. PATENT DOCUMENTS

| | | | |
|---|---|---|---|
| 4,133,773 A | 1/1979 | Simmons | 252/359 |
| 4,156,619 A | 5/1979 | Griesshammer | 134/2 |
| 4,238,244 A | 12/1980 | Banks | 134/22 |
| 4,781,764 A | 11/1988 | Leenaars | 134/34 |
| 4,817,652 A | 4/1989 | Liu et al. | 134/102 |
| 4,838,289 A | 6/1989 | Kottman et al. | |
| 4,849,027 A | 7/1989 | Simmons | 134/22 |
| 4,911,761 A | 3/1990 | McConnell et al. | 134/11 |
| 4,962,776 A | 10/1990 | Liu et al. | 134/11 |
| 5,000,795 A | 3/1991 | Chung et al. | 134/37 |
| 5,048,549 A | 9/1991 | Hethcoat | |
| 5,102,777 A | 4/1992 | Lin et al. | 430/331 |
| 5,105,556 A | 4/1992 | Kurokawa et al. | 34/12 |
| 5,113,597 A | 5/1992 | Sylla | 34/22 |
| 5,175,124 A | 12/1992 | Winebarger | 437/180 |
| 5,181,985 A | 1/1993 | Lampert et al. | 156/635 |
| 5,226,969 A | 7/1993 | Watanabe et al. | |
| 5,242,669 A | 9/1993 | Flor | |
| 5,271,774 A | 12/1993 | Leenaars et al. | |
| 5,288,332 A | 2/1994 | Pustilnik et al. | 134/27 |
| 5,306,350 A | 4/1994 | Hoy et al. | 134/22.14 |
| 5,336,371 A | 8/1994 | Chung et al. | 156/659.1 |
| 5,415,191 A | 5/1995 | Mashimo et al. | 134/102.1 |
| 5,417,768 A | 5/1995 | Smith et al. | 134/10 |
| 5,464,480 A | 11/1995 | Matthews | 134/1.3 |
| 5,472,502 A | 12/1995 | Batchelder | 118/52 |
| 5,494,526 A | 2/1996 | Paranjpe | 134/1 |
| 5,498,293 A | 3/1996 | Ilardi et al. | 134/3 |
| 5,656,097 A | 8/1997 | Olesen et al. | 134/1 |
| 5,660,642 A | 8/1997 | Britten | |
| 5,705,223 A | 1/1998 | Bunkofske | |
| 5,800,626 A | 9/1998 | Cohen et al. | |
| 5,858,283 A | 1/1999 | Burris | 261/122.1 |
| 5,900,191 A | 5/1999 | Gray et al. | 261/59 |
| 5,904,156 A | 5/1999 | Advocate, Jr. et al. | 134/2 |
| 5,908,509 A | 6/1999 | Olesen et al. | 134/1.3 |
| 5,911,837 A | 6/1999 | Matthews | 134/2 |
| 5,932,493 A | 8/1999 | Akatsu et al. | 438/745 |
| 5,944,581 A | 8/1999 | Goenka | |
| 5,944,582 A | 8/1999 | Talieh | |
| 5,945,351 A | 8/1999 | Mathuni | |
| 5,951,779 A | 9/1999 | Koyanagi et al. | 134/2 |
| 5,964,954 A | 10/1999 | Matsukawa et al. | |
| 5,964,958 A | 10/1999 | Ferrell et al. | 134/26 |
| 5,968,285 A | 10/1999 | Ferrell et al. | 134/26 |
| 5,997,653 A | 12/1999 | Yamasaka | |
| 6,048,409 A | 4/2000 | Kanno et al. | 134/34 |
| 6,049,996 A | 4/2000 | Freeman | |
| 6,081,650 A | 6/2000 | Lyons et al. | |
| 6,090,217 A | 7/2000 | Kittle | 134/11 |
| 6,092,538 A | 7/2000 | Arai et al. | 134/1.3 |
| 6,152,805 A | 11/2000 | Takahashi | |
| 6,158,445 A | 12/2000 | Olesen et al. | 134/1.3 |
| 6,167,583 B1 | 1/2001 | Miyashita et al. | |
| 6,228,563 B1 | 5/2001 | Starov et al. | |
| 6,267,125 B1 | 7/2001 | Bergman et al. | |
| 6,270,584 B1 | 8/2001 | Ferrell et al. | 134/26 |
| 6,272,712 B1 | 8/2001 | Gockel et al. | |
| 6,276,459 B1 | 8/2001 | Herrick et al. | 169/14 |
| 6,286,231 B1 | 9/2001 | Bergman et al. | 34/410 |
| 6,290,780 B1 | 9/2001 | Ravkin | |
| 6,296,715 B1 | 10/2001 | Kittle | 134/2 |
| 6,319,801 B1 | 11/2001 | Wake et al. | 438/585 |
| 6,352,082 B1 | 3/2002 | Mohindra et al. | 134/25.4 |
| 6,386,956 B1 | 5/2002 | Sato et al. | |
| 6,398,975 B1 | 6/2002 | Mertens et al. | |
| 6,401,734 B1 | 6/2002 | Morita et al. | |
| 6,423,148 B1 | 7/2002 | Aoki | 134/3 |
| 6,439,247 B1 | 8/2002 | Kittle | 134/102.1 |
| 6,457,199 B1 | 10/2002 | Frost et al. | |
| 6,491,043 B2 | 12/2002 | Mohindra et al. | 134/25.4 |
| 6,491,764 B2 | 12/2002 | Mertens et al. | |
| 6,493,902 B2 | 12/2002 | Lin | |
| 6,513,538 B2 | 2/2003 | Chung et al. | 134/1.2 |
| 6,514,921 B1 | 2/2003 | Kakizawa et al. | 510/175 |
| 6,527,870 B2 | 3/2003 | Gotkis | |
| 6,532,976 B1 | 3/2003 | Huh et al. | 134/111 |
| 6,537,915 B2 | 3/2003 | Moore et al. | |
| 6,562,726 B1 | 5/2003 | Torek et al. | 438/745 |
| 6,576,066 B1 | 6/2003 | Namatsu | 134/30 |
| 6,594,847 B1 | 7/2003 | Krusell et al. | |
| 6,616,772 B2 | 9/2003 | de Larios et al. | |
| 6,733,596 B1 | 5/2004 | Mikhaylichenko et al. | 134/60 |
| 6,787,473 B2 | 9/2004 | Andreas | 438/692 |
| 6,797,071 B2 | 9/2004 | Kittle | 134/11 |
| 6,802,911 B2 | 1/2005 | Dickinson et al. | |
| 6,846,380 B2 | 1/2005 | Dickinson et al. | |
| 6,851,435 B2 | 2/2005 | Mertens et al. | |
| 6,874,516 B2 | 4/2005 | Matsuno et al. | |
| 6,896,826 B2 | 5/2005 | Wojtczak et al. | 252/79.1 |
| 6,927,176 B2 | 8/2005 | Verhaverbeke et al. | 438/745 |
| 6,946,396 B2 | 9/2005 | Miyazawa et al. | 438/689 |
| 6,951,042 B1 | 10/2005 | Mikhaylichenko et al. | 15/77 |
| 7,122,126 B1 | 10/2006 | Fuentes | |
| 7,648,584 B2 * | 1/2010 | Freer et al. | 134/6 |
| 2002/0072482 A1 | 6/2002 | Sachdev et al. | 510/175 |
| 2002/0094684 A1 | 7/2002 | Hirasaki et al. | |
| 2002/0121290 A1 | 9/2002 | Tang et al. | |
| 2002/0185164 A1 | 12/2002 | Tetsuka et al. | |
| 2002/0195121 A1 | 12/2002 | Kittle | |
| 2003/0075204 A1 | 4/2003 | de Larios et al. | |
| 2003/0148903 A1 | 8/2003 | Bargaje et al. | |
| 2003/0171239 A1 | 9/2003 | Patel et al. | |
| 2003/0226577 A1 | 12/2003 | Orll et al. | |
| 2004/0002430 A1 | 1/2004 | Verhaverbeke | 510/175 |
| 2004/0053808 A1 | 3/2004 | Raehse et al. | |
| 2004/0134515 A1 | 7/2004 | Castrucci | 134/2 |
| 2004/0159335 A1 | 8/2004 | Montierth et al. | |
| 2004/0163681 A1 | 8/2004 | Verhaverbeke | 134/28 |
| 2004/0261823 A1 | 12/2004 | de Larios et al. | |
| 2005/0045207 A1 | 3/2005 | Nitta et al. | |
| 2005/0132515 A1 | 6/2005 | Boyd et al. | |
| 2005/0133060 A1 | 6/2005 | de Larios et al. | |
| 2005/0133061 A1 | 6/2005 | de Larios et al. | |
| 2005/0159322 A1 | 7/2005 | Min et al. | 510/175 |
| 2005/0176606 A1 | 8/2005 | Konno et al. | |
| 2005/0183740 A1 | 8/2005 | Fulton et al. | 134/3 |
| 2006/0201267 A1 | 9/2006 | Liu | |
| 2006/0283486 A1 | 12/2006 | de Larios et al. | |
| 2006/0285930 A1 | 12/2006 | de Larios et al. | 406/197 |
| 2006/2084930 | 12/2006 | Korolik et al. | |
| 2007/0000518 A1 | 1/2007 | de Larios et al. | |

FOREIGN PATENT DOCUMENTS

| | | |
|---|---|---|
| EP | 0827188 | 3/1998 |
| EP | 0905746 | 3/1999 |
| EP | 11-334874 | 12/1999 |
| EP | 0989600 | 3/2000 |
| EP | 1080797 | 3/2001 |
| EP | 1803804 A2 * | 7/2007 |
| JP | 53-076559 | 7/1978 |
| JP | 56-084618 | 7/1981 |
| JP | 56-084619 | 7/1981 |
| JP | 59-24849 | 2/1984 |
| JP | 60-005529 | 1/1985 |
| JP | 62-119543 | 5/1987 |
| JP | 63-077510 | 4/1988 |
| JP | 02-309638 A | 12/1990 |
| JP | 5-15857 | 1/1993 |
| JP | 06-177101 | 6/1994 |
| JP | 07-006993 | 1/1995 |
| JP | 11-350169 | 12/1999 |
| JP | 2001-064688 | 3/2001 |

| | | |
|---|---|---|
| JP | 2002-66475 | 3/2002 |
| JP | 2002-280330 A | 9/2002 |
| JP | 2002-309638 | 10/2002 |
| JP | 2003-282513 | 10/2003 |
| JP | 2005-194294 | 7/2005 |
| WO | WO-99/16109 | 4/1999 |
| WO | WO-00/33980 | 6/2000 |
| WO | WO-00/59006 | 10/2000 |
| WO | WO-01/12384 | 2/2001 |
| WO | WO-02/101795 | 12/2002 |
| WO | WO-2005/006424 | 1/2005 |
| WO | WO 2005/064647 | 7/2005 |

OTHER PUBLICATIONS

Kittle, et al.; "Semiconductor Wafer Cleaning and Drying Using a Foam Medium"; <hhttp://www.aquafoam.com/papers;SCI0202.pdf>; Sematech Novel Wafer Cleans Working Group Meeting, Internet Presetation; Nov. 13, 2001.

Hunter; "Introduction to Modern Colloid Sience"; Oxford University Press; Feb. 1, 1994.

Lester; "Is Foam Wafer Cleaning and Drying the Future?" <http://www.aquafoam.com/papers/SCI0202.pdf>; Semiconductor International, 25, #2; Feb. 1, 2002.

Kirkpatrick et al.; "Advanced Wafer-Cleaning Evolution"; Solid State Technology; May 1, 2003; www.solid-state.com.

Weaire et al.; "The Physics of Foams"; Department of Physics; Trinity Collolge, Dublin; 1999.

Kittle, et al.; "Photoresist Residue Removal Using Aqueous Foam Proof of Concept Experiments"; Internet; http://www.aquafoam.com/paper/Proof-11MB.pdf;<papers/A2C2photoresist.pdf>; 13-17; May 1, 2002.

Lide; "Air Composition"; CRC handbook of Chemistry and Physics; 1997.

U.S. Appl. No. 11/639,752, filed Dec. 15, 2006, Boyd et al.

U.S. Appl. No. 11/743,283, filed May 2, 2007, Freer et al.

* cited by examiner

METHOD AND MATERIAL FOR CLEANING A SUBSTRATE

APPLICATION FOR CLAIM OF PRIORITY

This application claims the benefit of U.S. Provisional Application No. 60/755,377, filed Dec. 30, 2005. The disclosure of the above-identified application is incorporated herein by reference.

CROSS REFERENCE TO RELATED APPLICATIONS

This application is related to U.S. patent application Ser. No. 10/816,337, filed on Mar. 31, 2004, and entitled "Apparatuses and Methods for Cleaning a Substrate," U.S. patent application Ser. No. 11/153,957, filed on Jun. 15, 2005, and entitled "Method and Apparatus for Cleaning a Substrate Using Non-Newtonian Fluids," U.S. patent application Ser. No. 11/154,129, filed on Jun. 15, 2005, and entitled "Method and Apparatus for Transporting a Substrate Using Non-Newtonian Fluid," U.S. patent application Ser. No. 11/174,080, filed on Jun. 30, 2005, and entitled "Method for Removing Material from Semiconductor Wafer and Apparatus for Performing the Same," U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids," U.S. patent application Ser. No. 11/336,215, filed on Jan. 20, 2006, entitled "Method and Apparatus for removing contamination from a substrate," U.S. patent application Ser. No. 11/346,894, filed on Feb. 3, 2006, entitled "Method for removing contamination from a substrate and for making a cleaning solution," and U.S. patent application Ser. No. 11/347,154, filed on Feb. 3, 2006, entitled "Cleaning compound and method and system for using the cleaning compound." The disclosure of each of the above-identified related applications is incorporated herein by reference.

BACKGROUND

In the fabrication of semiconductor devices such as integrated circuits, memory cells, and the like, a series of manufacturing operations are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contamination from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

Conventional wafer cleaning methods have relied heavily on mechanical force to remove particulate contamination from the wafer surface. As feature sizes continue to decrease and become more fragile, the probability of feature damage due to application of mechanical force to the wafer surface increases. For example, features having high aspect ratios are vulnerable to toppling or breaking when impacted by a sufficient mechanical force. To further complicate the cleaning problem, the move toward reduced feature sizes also causes a reduction in the size of particulate contamination. Particulate contamination of sufficiently small size can find its way into difficult to reach areas on the wafer surface, such as in a trench surrounded by high aspect ratio features. Thus, efficient and non-damaging removal of contaminants during modern semiconductor fabrication represents a continuing challenge to be met by continuing advances in wafer cleaning technology. It should be appreciated that the manufacturing operations for flat panel displays suffer from the same shortcomings of the integrated circuit manufacturing discussed above.

In view of the forgoing, there is a need for a more effective and less abrasive cleaning material and method for cleaning wafer surfaces.

SUMMARY

Broadly speaking, the present invention fills these needs by providing improved methods and materials for cleaning wafer surfaces. It should be appreciated that the present invention can be implemented in numerous ways, including as an apparatus, a method and a system. Several inventive embodiments of the present invention are described below.

In one embodiment, a method for cleaning is disclosed. A substrate having a particle deposited thereon is provided. A tri-state body that has a solid portion, liquid portion, and a gas portion is generated. A force is applied over the tri-state body to promulgate an interaction between the solid portion and the particle. The tri-state body is removed along with the particle from the surface of the substrate. The interaction between the solid portion and the particle causing the particle to be removed along with the tri-state body off of the substrate.

In another embodiment, a cleaning material for preparing a substrate is disclosed. The cleaning material has a liquid component, a solid component, and a gas component. The solid component is defined a plurality of solids that are dispersed within the liquid component. The gas component is intermixed with the liquid component and the solid component to define the cleaning material in a state that is applied to the substrate.

In still another embodiment, another cleaning method is disclosed. A substrate is provided, wherein the substrate has a particle deposited thereon. A tri-state body that is defined by a surfactant in a substantial solid phase, a liquid portion in a liquid phase, and a gas portion in a gas phase is generated prior to the application to the substrate. The tri-state body is applied to the surface of the substrate in such a manner that the surfactant interacts with the particle on the substrate surface. The tri-state body is then removed from the surface of the substrate, where the interaction between the surfactant and the particle causes the particle to be removed along with the tri-state body.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for methods and materials for cleaning wafer surfaces. It will be obvious, however, to one skilled in the art, that the present invention may be practiced without some or all of these specific details. In other instances, well known process operations have not been described in detail in order not to unnecessarily obscure the present invention.

As used herein, a tri-state body cleaning material contains a plurality of tri-state bodies that include a gas phase, a liquid phase and a solid phase. In one embodiment, the gas phase and liquid phase provides an intermediary to bring the solid phase into close proximity with contaminant particles 102 on a substrate surface. For further explanation of the composition of the tri-state body cleaning material and its mechanisms see U.S. patent application Ser. No. 11/346,894, filed on Feb. 3, 2006, entitled "Method for removing contamination from a substrate and for making a cleaning solution," U.S. patent application Ser. No. 11/347,154, filed on Feb. 3, 2006, entitled "Cleaning compound and method and system for using the cleaning compound" and U.S. patent application Ser. No. 11/336,215, filed on Jan. 20, 2006, entitled "Method and Apparatus for removing contamination from a substrate." The solid phase interacts with the particles 102 during cleaning to effectuate their removal. A substrate, as an example used herein, denotes without limitation, semiconductor wafers, hard drive disks, optical discs, glass substrates, and flat panel display surfaces, liquid crystal display surfaces, etc., which may become contaminated during manufacturing or handling operations. Depending on the actual substrate, a surface may become contaminated in different ways, and the acceptable level of contamination is defined in the particular industry in which the substrate is handled.

Figure 1:
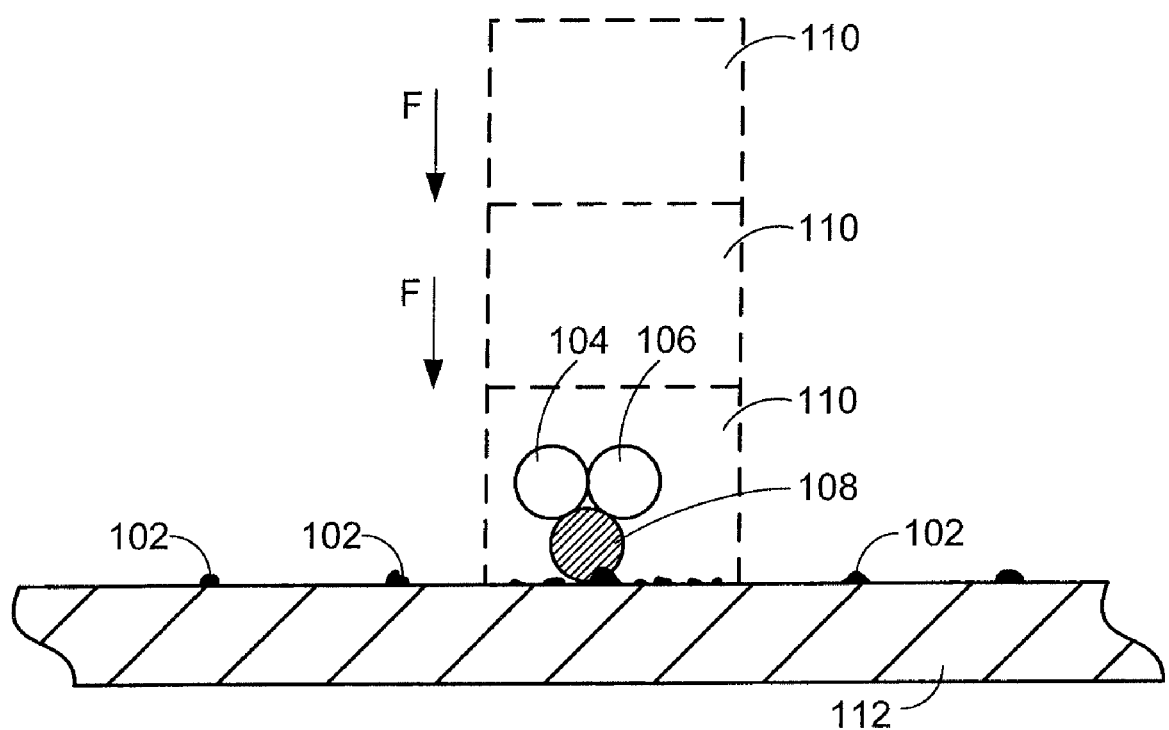
FIG. 1 is an illustration of a tri-state body interacting with a contaminant particle, in accordance with one embodiment of the present invention.

FIG. 1 is an illustration of a tri-state body interacting with a contaminant particle, in accordance with one embodiment of the present invention. In this depiction, the tri-state body 110 includes a gas portion 104, a liquid portion 106, and a solid portion 108. When a force is applied against the tri-state body 110 towards the surface of a substrate 112, the tri-state body 110 interacts with contaminant particles 102 situated on the surface of the substrate 112 as it moves closer to the particles 102. In one embodiment, the force (F), or a normal component of F, is applied by tri-state bodies 110 adjacent to the tri-state body 110 moving towards and interacting with the contaminant particles 102. In another embodiment, the F is applied by a fluid (e.g., gas or liquid) against the tri-state body 110 towards the substrate 112 surface. In still another embodiment, the F is applied by mechanical applicator such as a blade. It should be appreciated that the F can be applied using any apparatus so long as the substrate 112 cleaning properties of the tri-state body 110 is not substantially compromised by the apparatus during the application of F. In one embodiment, the fluid is a gas such as air, nitrogen ($N_2$), carbon dioxide ($CO_2$) and argon (Ar). In another embodiment, the fluid is a liquid that is immiscible with the liquid portion 106 of the tri-state body 110.

As depicted in FIG. 1, the force serves to move the solid portion 108 towards the substrate 112 and the contaminant particle 102 thereon. In one embodiment, the interaction between the solid portion 108 and the contaminant particle 102 occurs when the solid portion 108 is forced sufficiently close to the contaminant particle 102. Interaction between the solid portion 108 and the contaminant particle 102 can be established through one or more mechanisms including adhesion (e.g., chemical or physical), collision (i.e., transfer of momentum or kinetic energy), attractive forces (e.g., steric forces, electrostatic forces, etc.), physical and chemical bonding (e.g., covalent bonding, hydrogen bonding, etc.), among others. The interaction between the solid portion 108 and the contaminant particle 102 must be sufficient to overcome any adhesive forces between the contaminant particle 102 and the substrate 112, as well as any repulsive forces between the solid portion 108 and the contaminant particle 102. Therefore, when the solid portion 108 is moved away from the substrate 112, the contaminant particle 102 that interacted with the solid portion 108 is also removed or repulsed off the substrate 112.

In one embodiment, the gas portion 104 is defined to occupy 5% to 99.9% of the tri-state body 110 cleaning material by volume. The gas or gases defining the gas portion 104 can be either inert, e.g., nitrogen ($N_2$), argon (Ar), etc., or reactive, e.g., oxygen ($O_2$), ozone ($O_3$), hydrogen peroxide ($H_2O_2$), air, hydrogen ($H_2$), ammonia ($NH_3$), hydrogen fluoride (HF), hydrochloric acid (HCl), etc. In one embodiment, the gas portion 104 includes only a single type of gas, for example, nitrogen ($N_2$). In another embodiment, the gas portion 104 is a gas mixture that includes mixtures of various types of gases, such as: ozone ($O_3$), oxygen ($O_2$), carbon dioxide ($CO_2$), hydrochloric acid (HCl), hydrofluoric acid (HF), nitrogen (N2), and argon (Ar); ozone ($O_3$) and nitrogen ($N_2$); ozone ($O_3$) and argon (Ar); ozone ($O_3$), oxygen ($O_2$) and nitrogen ($N_2$); ozone ($O_3$), oxygen ($O_2$) and argon (Ar); ozone ($O_3$), oxygen ($O_2$), nitrogen ($N_2$), and argon (Ar); and oxygen ($O_2$), argon (Ar), and nitrogen ($N_2$). It should be appreciated that the gas portion 104 can include essentially any combination of gas types as long as the resulting gas mixture can be combined with a liquid portion 106 and a solid portion 108 to form a tri-state body 110 that can be utilized in substrate 112 cleaning or preparation operations.

Still with FIG. 1, it should be understood that depending on the particular embodiment, the solid portion 108 of the tri-state body 110 may possess physical properties representing essentially any sub-state, wherein the solid portion 108 is defined as a portion other than the liquid 106 or gas portions 104. For example, physical properties such as elasticity and plasticity can vary among different types of solid portions 108 within the tri-state body 110. Additionally, it should be understood that in various embodiments the solid portion 108 can be defined as crystalline solids or non-crystalline solids. Regardless of their particular physical properties, the solid portion 108 of the tri-state body 110 should be capable of avoiding adherence to the substrate 112 surface when positioned in either close proximity to or in contact with the substrate 112 surface or capable of being easily removed (e.g., hydrodynamic removal with rinse). Additionally, the physical properties of the solid portion 108 should not cause damage to the substrate 112 surface during the cleaning process. Furthermore, the solid portion 108 should be capable of establishing an interaction with the contaminant particle 102 present on the substrate 112 surface when positioned in either close proximity to or contact with the particle 102. In one embodiment, the solid portion 108 has foam inhibiting properties. In another embodiment, the solid portion 108 has foam enhancing properties. Depending on the application and the apparatus used to handle the tristate body, the foam enhancing or inhibiting properties can be adjusted, either in a stepped manner or in accordance with a recipe.

In one embodiment, the solid portion 108 avoids dissolution into the liquid portion 106 and gas portions 104 and has a surface functionality that enables dispersion throughout the liquid portion 106. In another embodiment, the solid portions 108 does not have surface functionality that enables dispersion throughout the liquid portion 106, therefore requiring chemical dispersants to be added to the liquid portion 106 to before the solid portions 108 can be dispersed through the liquid portion 106. In one embodiment, the solid portions 108 form through a precipitation reaction where a dissolved component in the liquid phase 106 reacts by the addition of one or more components to form an insoluble compound. In one embodiment, the solid portion 108 goes into suspension in the liquid portion 106 when a base is added to the liquid portion 106 (i.e., by altering the zeta potential). Depending on their specific chemical characteristics and their interaction with the surrounding liquid portion 106, the solid portion 108 may take one or more of several different forms.

For example, in various embodiments the solid portion 108 may form aggregates, colloids, gels, coalesced spheres, or essentially any other type of agglutination, coagulation, flocculation, agglomeration, or coalescence. It should be appreciated that the exemplary list of solid portion 108 forms identified above is not intended to represent an inclusive list, and alternates or extensions falling within the spirit of the disclosed embodiments are possible. It should further be understood that the solid portion 108 can be defined as essentially any solid material capable of functioning in the manner previously described with respect to their interaction with the substrate 112 and the contaminant particle 102.

Continuing with FIG. 1, some exemplary types of materials that can be used to make up the solid portion 108 includes aliphatic acids, carboxylic acids, paraffin, wax, polymers, polystyrene, polypeptides, and other visco-elastic materials. The solid portion 108 material should be present at a concentration that exceeds its solubility limit within the liquid portion 106. Also, it should be understood that the cleaning effectiveness associated with a particular solid portion 108 material may vary as a function of temperature, pH, and other environmental conditions.

The aliphatic acids represent essentially any acid defined by organic compounds in which carbon atoms form open chains. A fatty acid is an example of an aliphatic acid that can be used as the solid portion 108 within the tri-state body 110 cleaning material. Examples of fatty acids that may be used as the solid portion 108 include lauric acid, palmitic acid, stearic acid, oleic acid, linoleic acid, linolenic acid, arachidonic acid, gadoleic acid, eurcic acid, butyric acid, caproic acid, caprylic acid, myristic acid, margaric acid, behenic acid, lignoseric acid, myristoleic acid, palmitoleic acid, nervanic acid, parinaric acid, timnodonic acid, brassic acid, clupanodonic acid, lignoceric acid, cerotic acid, and mixtures thereof, among others. In one embodiment, the solid portion 108 can represent a mixture of fatty acids defined by various carbon chain lengths extending from C-1 to about C-26. Carboxylic acids are defined by essentially any organic acid that includes one or more carboxyl groups (COOH). When used as the solid portion 108 of a tri-state body 110, the carboxylic acids can include mixtures of various carbon chain lengths extending from C-1 through about C-100. Also, the carboxylic acids can include long-chain alcohols, ethers, and/or ketones, above the solubility limit in the liquid portion 106 of the tri-state body 110. In one embodiment, the fatty acid used in the solid portion 108 acts as a surfactant when coming into contact with the contaminant particle 102.

Still referring to FIG. 1, the liquid portion 106 can be either aqueous or non-aqueous. In one embodiment, an aqueous liquid portion 106 is defined by water (de-ionized or otherwise) alone. In another embodiment, an aqueous liquid portion 106 is defined by water in combination with other constituents that are in solution with the water. In still another embodiment, a non-aqueous liquid portion 106 is defined by a hydrocarbon, a fluorocarbon, a mineral oil, or an alcohol, among others. Irrespective of whether the liquid portion 106 is aqueous or non-aqueous, it should be understood that the liquid portion 106 can be modified to include ionic or non-ionic solvents and other chemical additives. For example, the chemical additives to the liquid portion 106 can include any combination of co-solvents, pH modifiers (e.g., acids and bases), chelating agents, polar solvents, surfactants, ammonia hydroxide, hydrogen peroxide, hydrofluoric acid, potassium hydroxide, sodium hydroxide, tetramethylammonium hydroxide, and rheology modifiers such as polymers, particulates, and polypeptides.

Figure 2:
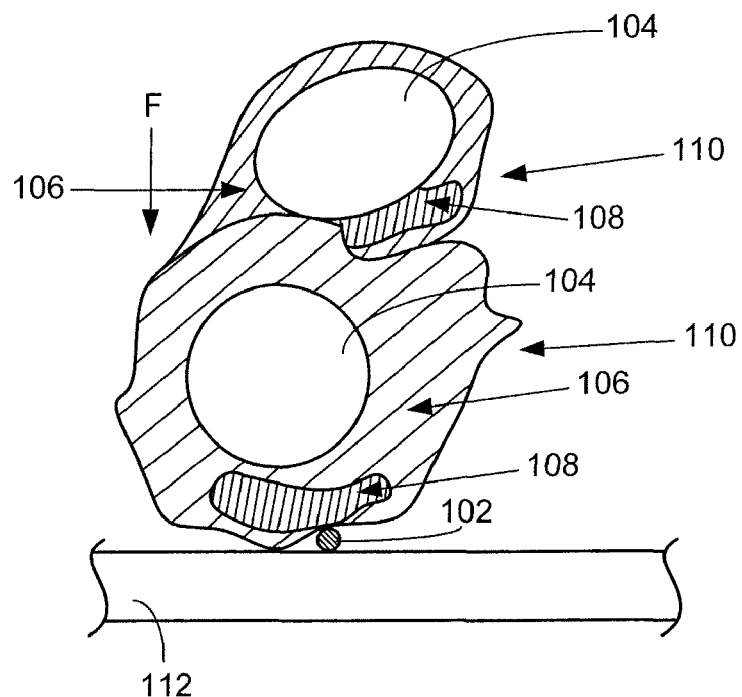
FIG. 2 is an illustration of a first tri-state body applying a force over a second tri-state body to create an interaction between the solid portion of the second tri-state body and the contaminant particle, in accordance with one embodiment of the present invention.

FIG. 2 is an illustration of a first tri-state body applying a force over a second tri-state body to create an interaction between the solid portion of the second tri-state body and the contaminant particle, in accordance with one embodiment of the present invention. In this depiction, a first tri-state body 110 including a gas portion 104, liquid portion 106 and a solid portion 108 is positioned above and over a second tri-state body 110 having the same. The first tri-state body 110 is shown applying a downward force against the second tri-state body 110 instigating an interaction between the solid portion 108 and the contaminant particle 102 on the substrate 112 surface. The downward force results when the gas portion 104, liquid portion 106 and solid portion 108 of the first tri-state body 110 contacts the same in the second tri-state body 110 causing a transfer in kinetic energy from the first tri-state body 110 to the second tri-state body 110. This transfer causes the second tri-state body 110 to move towards the contaminant particle 102 thus creating an interaction between the solid portion 108 of the second tri-state body 110 and the particle 102. As discussed above, the interaction may be established through one or more mechanisms including adhesion, collision, and attractive forces. Also, the term "downward" is noted herein, however, the force can be applied from any angle or direction. Consequently, an "upward" "sideways" or other directional force can be filed, and the directionality may be important when the force is applied to a substrate that may not be in the flat position, but may be at an angle, or vertically arranged or held.

In one embodiment, a pressure (i.e., force) exerted by a fluid causes the first tri-state body 110 to apply a force against the second tri-state body 110. It should be appreciated that the fluid can be either a liquid or a gas as long as the fluid can be utilized to apply a pressure against the tri-state bodies 110 (i.e., deformable droplets and bubbles) and does not appreciably dissolve into the gas portion 104, liquid portion 106, and solid portion 108 of the tri-state bodies 110. In another embodiment, tri-state bodies 110 adjacent to and in contact with the first tri-state body 110 applies a force against the first tri-state body 110 cascading into the second tri-state body 110 and applying a force against the second tri-state body 110.

Figure 3:
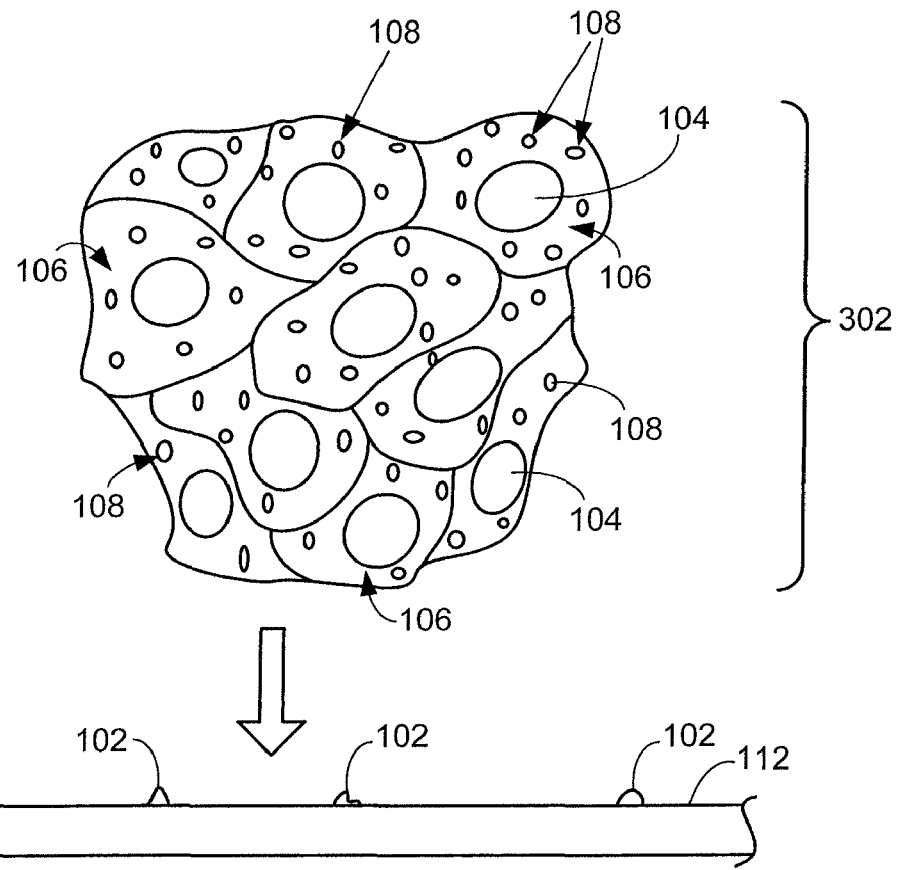
FIG. 3 is an illustration of a tri-state body cleaning material formed prior to being applied against the surface of a substrate, in accordance with one embodiment of the present invention.

FIG. 3 is an illustration of a tri-state body cleaning material formed prior to being applied against the surface of a substrate, in accordance with one embodiment of the present invention. As depicted herein, the tri-state body cleaning material 302 includes a plurality of tri-state bodies 110 each having a gas portion 104, liquid portion 106, and a solid portion 108. The plurality of tri-state bodies 110 aggregating together as a unified tri-state body cleaning material 302 due to chemical bonding (e.g., covalent bonding, hydrogen bonding, etc.) between the liquid portions 106 of each of the tri-state bodies 110. As such the physical boundaries of the various tri-state bodies 110 are in a constant state of flux. In one embodiment, the tri-state body cleaning material 302 is in the form of a foam. The foam being a material that is comprised of a dispersed phase that is a gas and a continuous phase that is a liquid.

In one embodiment, the tri-state body cleaning material 302 is generated using an applicator prior to application to the substrate 112. The applicator taking the constituents that make-up the gas portion 104, liquid portion 106, and solid portion 108 of the tri-state bodies 110 and processing (by providing the appropriate agitation and/aeration) them to form the tri-state body cleaning material 302. Examples of applicator types that can be used to form the tri-state body cleaning material 302 include proximity heads, manifolds, spargers, mixers, etc. It should be understood that any applicator type can be used to form the tri-state body cleaning material 302 as long as the applicator can be configured to provide the necessary agitation and/or aeration to generate the tri-state body cleaning material 302. In another embodiment, the tri-state body cleaning material 302 is generated in a reservoir prior to dispensing via an applicator to the substrate 112 surface. The reservoir being configured to apply sufficient agitation and/or aeration to the starting materials of the tri-state bodies 110 to generate the tri-state body cleaning material 302.

Figure 4:
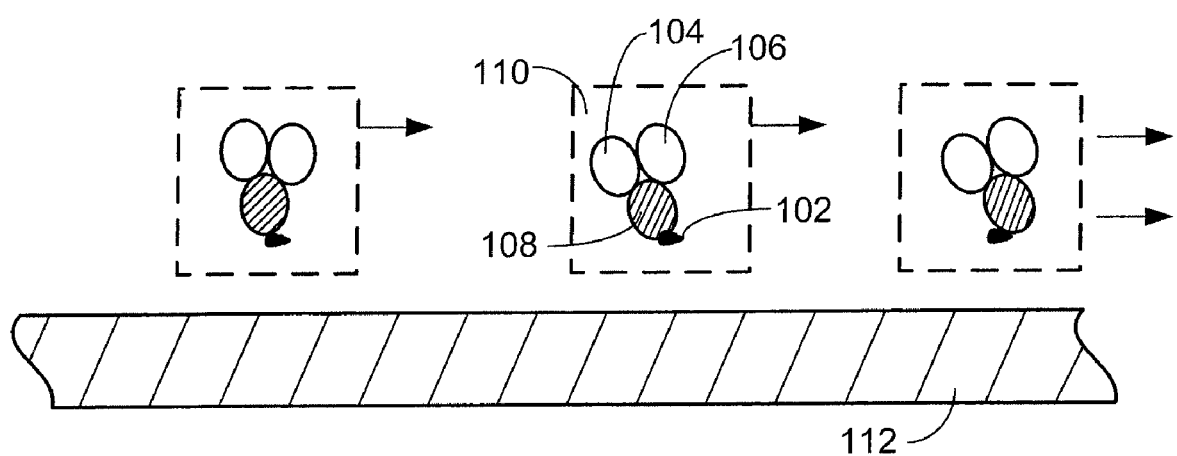
FIG. 4 is an illustration of a tri-state body removing a contaminant particle from the surface of a substrate, in accordance with one embodiment of the present invention.

FIG. 4 is an illustration of a tri-state body removing a contaminant particle from the surface of a substrate, in accordance with one embodiment of the present invention. In this depiction, the tri-state body 110 as shown includes a gas portion 104, a liquid portion 106 and a solid portion 108. The interaction between the solid portion 108 of the tri-state body 110 and the contaminant particle 102 results in the particle 102 being removed from the surface of the substrate 112 as the tri-state body 110 is removed from the surface of the substrate 112.

In one embodiment, the tri-state body 110 is removed by rinsing the surface of the substrate 112 with a liquid. The liquid directly contacts the tri-state body 110 to transport and remove the tri-state body 110 from the substrate 112 surface. In another embodiment, the tri-state body 110 is removed due to the attractive forces between the tri-state body 110 and adjacent tri-state bodies 110 that are themselves in the process of being removed form the substrate 112 surface. In still another embodiment, the tri-state body 110 is removed using an apparatus configured to mechanically sweep the tri-state body 110 off the surface of the substrate 112. It should be understood that the tri-state body 110 can be removed from the substrate 112 surface using any method as long the substrate 112 is not damaged as a result of the removal.

Figure 5:
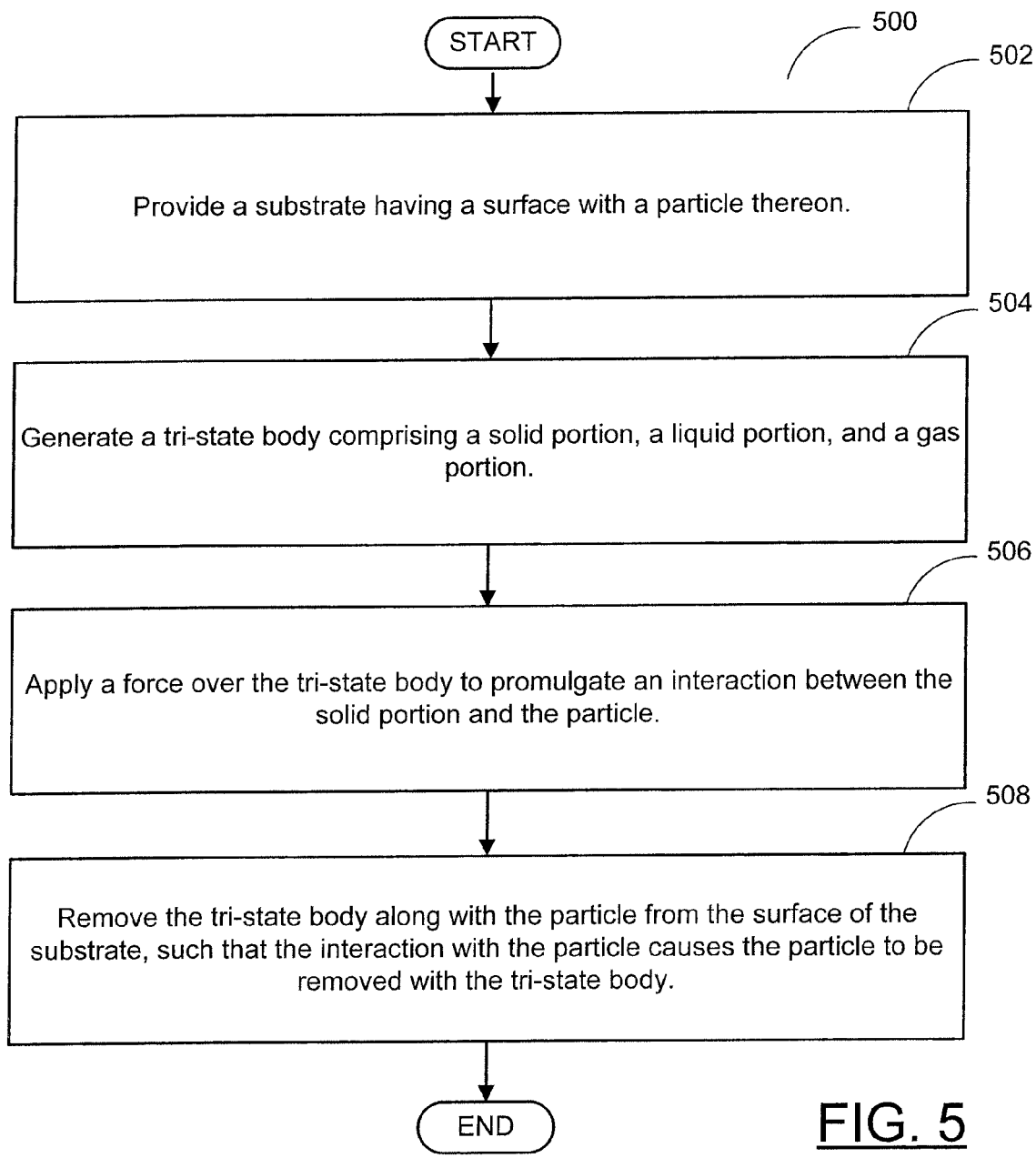
FIG. 5 is a flow chart of a method for using a tri-state body to clean the surface of a substrate, in accordance with one embodiment of the present invention.

FIG. 5 is a flow chart of a method for using a tri-state body to clean the surface of a substrate, in accordance with one embodiment of the present invention. Diagrams of the tri-state body and how they are utilized in this method are shown in FIGS. 1, 2, and 4. Method 500 begins with operation 502 where a substrate with a particle deposited thereon the surface is provided. As discussed previously, the substrate can be either a semiconductor wafer or any contaminated surface. The method 500 moves on to operation 504 where a tri-state body including a solid portion, a liquid portion, and a gas portion is generated. In one embodiment, the tri-state body is generated using a dispensing apparatus that is configured to process (via agitation and/or aeration) the raw material materials supplied to the apparatus into the tri-state body prior to dispensing. In another embodiment, the tri-state body is generated in a reservoir that stores the tri-state body cleaning material prior to being delivered to the dispensing apparatus for dispensing. In still another embodiment, the tri-state body is generated at the point of application through a series of chemical reactions that automatically occur as the tri-state body raw materials are dispensed from the dispensing apparatus.

The method 500 continues on to operation 506 where a force is applied over the tri-state body to promulgate an interaction between the solid portion of the tri-state body and the contaminant particle. As discussed previously, the force can be applied via a pressure or contact force supplied by a fluid or adjacent tri-state bodies that are disposed over the tri-state body towards the surface of the substrate. Alternatively, in one embodiment, the force is applied by an apparatus designed to apply mechanical force against the tri-state body towards the substrate surface.

Continuing with FIG. 5, the method 500 proceeds on to operation 508 where the tri-state body is removed along with the particle from the surface of the substrate such that the interaction between the solid portion of the tri-state body and the contaminant particle causes the particle to be removed along with the tri-state body. As discussed earlier, the interactions between the solid portion of the tri-state body and the contaminant particle can be established through one or more mechanisms including adhesion, collision, attractive forces, and chemical bonding.

Figure 6:
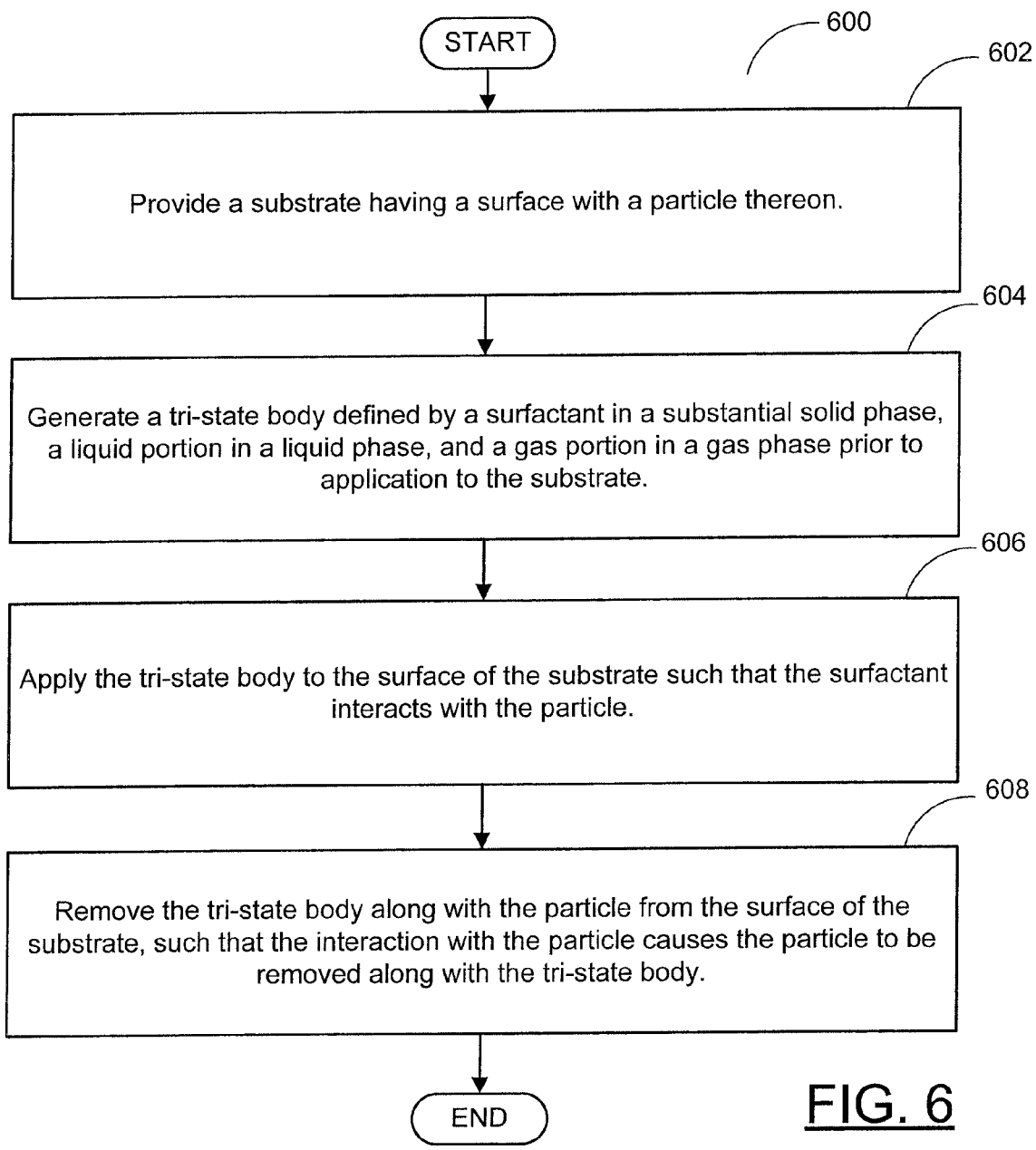
FIG. 6 is a flow chart of a method for using a tri-state body with a surfactant as a solid phase to clean the surface of a substrate, in accordance with one embodiment of the present invention.

FIG. 6 is a flow chart of a method for using a tri-state body with a surfactant as a solid phase to clean the surface of a substrate, in accordance with one embodiment of the present invention. Diagrams of the tri-state body and how they are utilized in this method are shown in FIGS. 1, 2, and 4. Method 600 begins with operation 602 where a substrate with a particle deposited thereon the surface is provided. The method 600 continues on to operation 604 where a tri-state body defined by a surfactant in a substantial solid phase, a liquid portion in a liquid phase, and a gas portion in a gas phase is generated. In one embodiment, the tri-state body is applied using a dispensing applicator that generates and dispenses the tri-state bodies onto the surface of the wafer. In another embodiment, the tri-state body is generated in a reservoir prior to dispensing by the dispensing applicator. In still another embodiment, the tri-state body is generated at the point of application through a series of chemical reactions that automatically occur as the tri-state body raw materials are dispensed from the dispensing apparatus.

In one embodiment, the surfactant is distributed throughout the liquid portion 106 to define a plurality of hydrocarbon chains having a carboxyl group attached to one end of each of the plurality of hydrocarbon chains the are in suspension. The plurality of hydrocarbon chains being adverse to flocculation. In one embodiment, the dispersion of the surfactant is activated through the application of a base to the tri-state body.

Still with FIG. 6, the method 600 then proceeds on to operation 606 where the tri-state body is applied to the surface of the substrate such that the surfactant interacts with the particle on the wafer surface. In one embodiment, a force is applied to the tri-state body, thus moving the surfactant so that it is proximate to or contacting the particle. The force is applied via a pressure supplied by a fluid or adjacent tri-state bodies that are disposed over the tri-state body towards the surface of the substrate. In another embodiment, the force is applied by an apparatus designed to apply mechanical force against the tri-state body towards the substrate surface.

The method 600 then moves on to operation 608 where the tri-state body is removed along with the particle from the surface of the substrate such that the interaction between the surfactant and the particle causes the particle to be removed along with the tri-state body. The interactions between the surfactant and the contaminant particle can be established through one or more mechanisms including adhesion, collision, attractive forces, and chemical bonding.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A cleaning method, comprising:
   providing a substrate having a surface, the surface having a particle thereon;
   generating a tri-state body comprising a solid portion, a liquid portion, and a gas portion;
   applying a force over the tri-state body to promulgate an interaction between the solid portion and the particle; and
   removing the tri-state body along with the particle from the surface of the substrate, such that the interaction with the particle causes the particle to be removed with the tri-state body, wherein the solid portion is distributed in the liquid portion to define a plurality of hydrocarbon chains having a carboxyl group attached to one end of each of the plurality of hydrocarbon chains that are in suspension and are adverse to flocculation among the plurality of hydrocarbon chains.

2. The cleaning method, as recited in claim 1, wherein the interaction defines one of a connection or transfer of momentum between the particle and the solid portion of the tri-state body.

3. The cleaning method, as recited in claim 2, wherein if the interaction is the connection, the connection is one of adhesion or repulsion.

4. The cleaning method, as recited in claim 1, wherein the liquid portion and the gas portion define an encapsulating transport, the gas portion further substantially filling the encapsulating transport.

5. The cleaning method, as recited in claim 4, wherein the gas portion is one of a gas mixture of,
   ozone ($O_3$), oxygen ($O_2$), hydrochloric acid (HCl), hydrofluoric acid (HF), nitrogen ($N_2$), and argon (Ar);
   ozone ($O_3$) and nitrogen ($N_2$);
   ozone ($O_3$) and argon (Ar);
   ozone ($O_3$), oxygen ($O_2$) and nitrogen ($N_2$);
   ozone ($O_3$), oxygen ($O_2$) and argon (Ar);
   ozone ($O_3$), oxygen ($O_2$), nitrogen ($N_2$), and argon (Ar); and
   oxygen ($O_2$), argon (Ar) and nitrogen ($N_2$).

6. The cleaning method, as recited in claim 4, wherein the encapsulating transport is combined with other encapsulating transports to define a foam, the encapsulating transports applying a force that causes the solid phase to come in proximity to the particle so as to facilitate the interaction with the solid portion and the particle on the surface of the substrate.

7. The cleaning method, as recited in claim 1, wherein the solid portion is defined outside of a gas phase and a liquid phase.

8. The cleaning method, as recited in claim 7, wherein the solid portion includes fatty acids.

9. The cleaning method, as recited in claim 1, wherein adjacent tri-state bodies positioned over the tri-state body apply the force.

10. The cleaning method, as recited in claim 1, wherein a lubricating layer between the solid portion provides hydrodynamic resistance to remove the contamination.

11. A cleaning method, comprising:
    providing a substrate having a surface, the surface having a particle thereon;
    generating a tri-state body defined by a surfactant in a substantial solid phase, a liquid portion in a liquid phase, and a gas portion in a gas phase prior to application to the substrate;
    applying the tri-state body to the surface of the substrate such that the surfactant interacts with the particle; and
    removing the tri-state body along with the particle from the surface of the substrate, such that the interaction between the surfactant and the particle causes the particle to be removed along with the tri-state body, wherein the liquid portion and the gas portion define an encapsulating transport, the gas portion further substantially filling the encapsulating transport, the encapsulating transport is combined with other encapsulating transports to define a foam, the encapsulating transports of the foam applying a force to the surfactant that causes the surfactant to be positioned proximate to the particle so as to initiate the interaction between the surfactant and the particle on the surface of the substrate, and the surfactant is distributed in the liquid portion to define a plurality of hydrocarbon chains having a carboxyl group attached to one end of each of the plurality of hydrocarbon chains that are in suspension and are adverse to flocculation among the plurality of hydrocarbon chains.

12. The cleaning method, as recited in claim 11, wherein the interaction defines a connection between the particle and the surfactant of the tri-state body.

13. The cleaning method, as recited in claim 11, further comprising:
    activating the suspension of the surfactant through an application of a base to the tri-state body.

* * * * *